United States Patent
Hsieh

(10) Patent No.: US 9,926,435 B2
(45) Date of Patent: Mar. 27, 2018

(54) RESIN COMPOSITION, COPPER-CLAD LAMINATE USING THE SAME, AND PRINTED CIRCUIT BOARD USING THE SAME

(71) Applicant: Elite Material Co., Ltd., Taoyuan (TW)

(72) Inventor: Chen-Yu Hsieh, Taoyuan (TW)

(73) Assignee: Elite Material Co., Ltd., Taoyuan (TW)

(*) Notice: Subject to any disclaimer, the term of this patent is extended or adjusted under 35 U.S.C. 154(b) by 141 days.

(21) Appl. No.: 15/067,144

(22) Filed: Mar. 10, 2016

(65) Prior Publication Data
US 2017/0260364 A1 Sep. 14, 2017

(51) Int. Cl.
- C08K 5/53 (2006.01)
- C08J 5/18 (2006.01)
- H05K 1/09 (2006.01)
- H05K 1/03 (2006.01)

(52) U.S. Cl.
CPC .............. C08K 5/53 (2013.01); C08J 5/18 (2013.01); H05K 1/0353 (2013.01); H05K 1/09 (2013.01); C08J 2371/00 (2013.01)

(58) Field of Classification Search
CPC ........................................ C08K 5/53
USPC ........................................ 428/462
See application file for complete search history.

(56) References Cited

PUBLICATIONS

Uchida et al; Halogen free fire retardant resin—to heat and moisture; Mar. 2006; Kyocera ChemicaL Corp., Japan; Chem Abstract 144:275086 (See 56 of 67 From the Search).*

* cited by examiner

*Primary Examiner* — Duc Truong
(74) *Attorney, Agent, or Firm* — Winston Hsu

(57) ABSTRACT

A resin composition, a copper-clad laminate using the same, and a printed circuit board using the same are introduced. The resin composition comprises a specific phosphorus-containing salt and a prepolymer of vinyl-containing polyphenylene ether. The resin composition features specific ingredients and proportion to thereby achieve satisfactory properties of prepreg made from the resin composition, and attain satisfactory laminate properties, such as high degree of heat resistance and satisfactory dielectric properties, and thus is suitable for producing a prepreg or a resin film to thereby be applicable to copper-clad laminates and printed circuit boards.

18 Claims, 1 Drawing Sheet

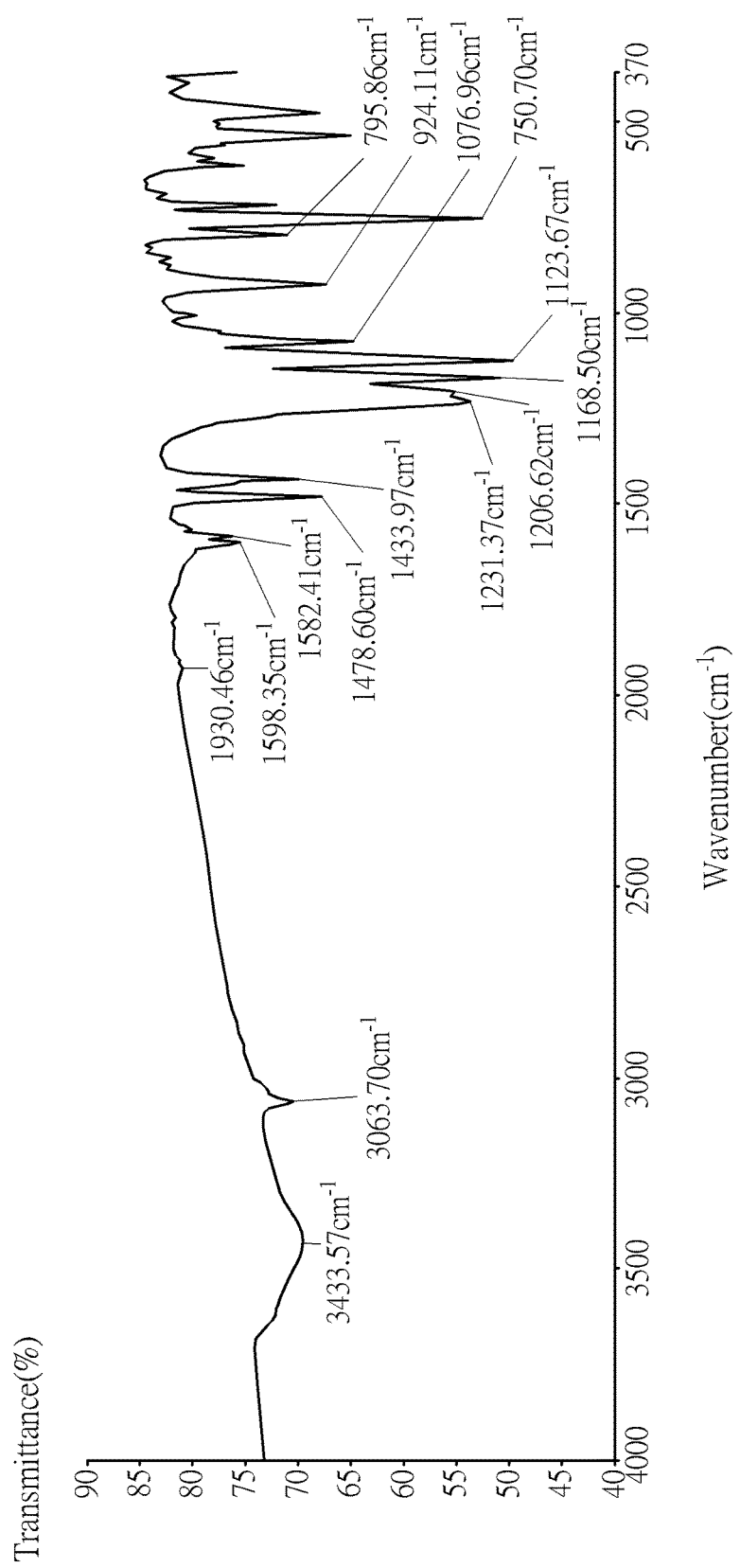

RESIN COMPOSITION, COPPER-CLAD LAMINATE USING THE SAME, AND PRINTED CIRCUIT BOARD USING THE SAME

BACKGROUND OF THE INVENTION

1. Field of the Invention

This invention relates to a resin composition and more particularly to a resin composition useful for copper-clad laminates and printed circuit boards.

2. Description of the Prior Art

With the rapid evolution of electronic technology, data processing of electronic products including mobile communication apparatuses, servers and cloud storage has been continuously developed towards signal transmission with high frequency signal transmission and high speed digitalization. Therefore, low-dielectric resin materials have become the mainstream for the development of laminates with high frequency and high transmission rate so as to meet the demands of high speed data processing. The material requirements for copper-clad laminates (CCL) are generally low dissipation factor (Df), high reliability, high thermal resistance, high moisture resistance and high dimensional stability (low dimensional expansion). Accordingly, it would be a desired goal for those skilled in the art to develop laminate and printed circuit board (PCB) with high performance.

Compared to other resin materials, polyphenylene ether resin (PPE resin or called polyphenylene oxide resin, PPO resin) becomes suitable material for high-frequency low-dielectric laminate due to its low dissipation factor property. However, the flame retardancy and the thermal resistance of conventional polyphenylene ethers are still insufficient. In addition, the dissipation factor usually becomes worse (higher) when conventional polyphenylene ethers are in collocation with flame retardants.

Therefore, it is still an important issue for manufacturer to provide a resin composition and an article made therefrom having low dissipation factor, high dimensional stability and excellent thermal resistance and flame retardancy, which can be applied to copper-clad laminates and printed circuit boards.

SUMMARY OF THE INVENTION

In order to solve the technical problems mentioned above, one of the objectives of the present invention is to provide a resin composition that includes polyphenylene ether resin with improved characteristics, which can be used for manufacturing a prepreg (PP) or a resin film to thereby be applicable to copper-clad laminate and printed circuit board, so as to achieve satisfactory properties, namely low dielectric properties, high thermal resistant, and high flame retardancy. In the resin composition, a prepolymer of vinyl-containing polyphenylene ether is used for obtaining a copper-clad laminate with better thermal resistance. In addition, a specific phosphorus-containing salt serves as the flame retardant is added in the resin composition in order to improve the flame retardancy of the prepolymer of polyphenylene ether while maintaining its low dissipation factor.

One of the embodiments of the present invention provides a resin composition which includes a specific phosphorus-containing salt and a prepolymer of vinyl-containing polyphenylene ether. The prepolymer of vinyl-containing polyphenylene ether is prepolymerized from vinyl-containing polyphenylene ether resin, maleimide, and a specific vinyl compound other than vinyl-containing polyphenylene ether resin and maleimide. The specific phosphorus-containing salt may be expressed by formula (I) below:

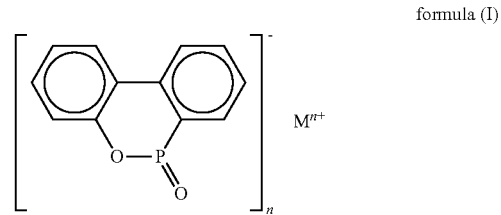

formula (I)

wherein $M^{n+}$ is a metal ion and n denotes an integer from 1 to 3. Preferably, $M^{n+}$ is a metal ion selected from the group consisting of $Al^{3+}$, $Ca^{2+}$ and $Zn^{2+}$.

In one preferred embodiment, the specific phosphorus-containing salt may be expressed by formula (II) below:

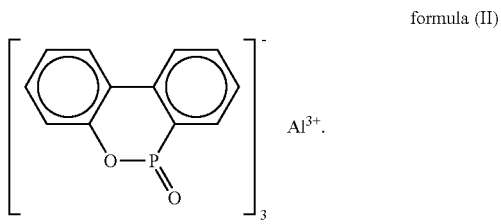

formula (II)

In one preferred embodiment, the vinyl-containing polyphenylene ether resin is a polyphenylene ether resin with at least one end group having an unsaturated double bond. Preferably, the vinyl-containing polyphenylene ether resin is expressed by formula (III) below:

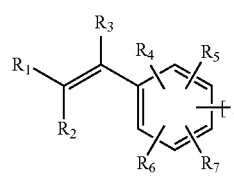
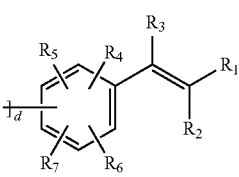

formula (III)

wherein $R_1$ and $R_2$ represent hydrogen atom, $R_3$, $R_4$, $R_5$, $R_6$ and $R_7$ are the same as or different from each other, each independently representing a hydrogen atom or an alkyl group;

—(O—X—O)— represents any one of formula (IV) or (V) expressed below:

formula (IV)

formula (V)

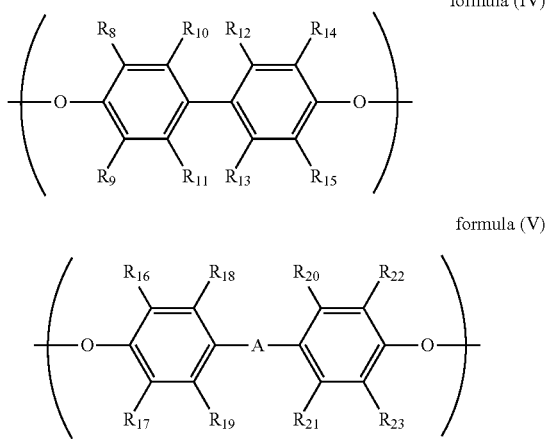

wherein $R_8$, $R_9$, $R_{10}$, $R_{11}$, $R_{12}$, $R_{13}$, $R_{14}$ and $R_{15}$ are the same as or different from each other, each independently representing a hydrogen atom, an alkyl group with 6 or less carbon atoms or a phenyl group; $R_{16}$, $R_{17}$, $R_{18}$, $R_{19}$, $R_{20}$, $R_{21}$, $R_{22}$, and $R_{23}$ are the same as or different from each other, each independently representing a halogen atom, an alkyl group with 6 or less carbon atoms or a phenyl group; and A represents a linear, branched or cyclic hydrocarbon with 20 or less carbon atoms, preferably a linear, branched or cyclic hydrocarbon with 6 or less carbon atom, and more preferably —$CH_2$— or —$C(CH_3)_2$—;

In one preferred embodiment, $R_8$, $R_9$, $R_{10}$, $R_{13}$, $R_{14}$ and $R_{15}$ are each independently representing a methyl group, and $R_{11}$ and $R_{12}$ are each independently representing a hydrogen atom.

In one preferred embodiment, $R_{16}$, $R_{17}$, $R_{22}$, and $R_{23}$ are each independently representing a methyl group, and $R_{18}$, $R_{19}$, $R_{20}$, and $R_{21}$ are each independently representing a hydrogen atom.

—(Y—O)— represents formula (VI) expressed below:

formula (VI)

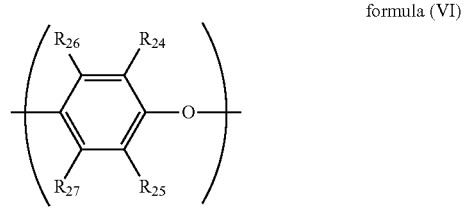

wherein $R_{24}$, $R_{25}$, $R_{26}$ and $R_{27}$ are the same as or different from each other, each independently representing a hydrogen atom, an alkyl group with 6 or less carbon atoms or a phenyl group;

In one preferred embodiment, $R_{24}$, and $R_{25}$ are each independently representing a methyl group, and $R_{26}$, and $R_{27}$ are each independently representing a hydrogen atom.

Z represents an organic group with at least one carbon atom; preferably, Z represents an alkyl group with 6 or less carbon atoms; alternatively, Z represents an organic group with at least one carbon atom, and the organic group may further contain an oxygen atom, a nitrogen atom, a sulfur atom and/or a halogen atom; for example, Z may be a methylene (—$CH_2$—); and a and b independently represent an integer from 1 to 30, and c and d are 1.

In one preferred embodiment, the vinyl-containing polyphenylene ether resin is expressed by formula (VII) below:

formula (VII)

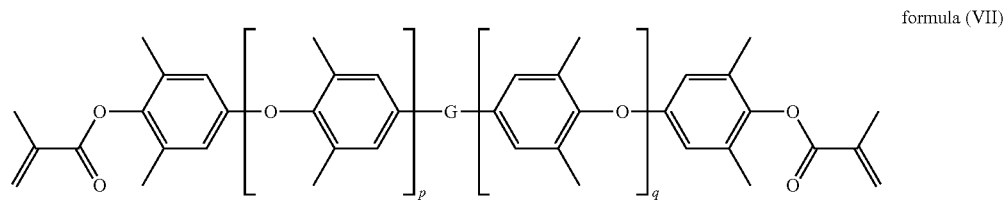

wherein G is bisphenol A, bisphenol F or a covalent bond, and p and q independently represent an integer of 1 to 15.

In one preferred embodiment of the present invention, the vinyl-containing polyphenylene ether resin includes at least one of methacrylate polyphenylene ether resin or vinylbenzyl polyphenylene ether resin or their combination. Preferably, the vinyl-containing polyphenylene ether resin is vinylbenzyl polyphenylene ether resin.

In one preferred embodiment, the specific vinyl compound, other than vinyl-containing polyphenylene ether resin and maleimide, includes at least one selected from the group consisting of divinylbenzene (DVB), bis(vinylbenzyl) ether (BVBE), triallyl isocyanurate (TAIC), triallyl cyanurate (TAC), 1,2,4-trivinylcyclohexane (TVCH), diallyl bisphenol A, styrene, brominated styrene, 2-propenoic acid, 1,1'-[(octahydro-4,7-methano-1H-indene-5,6-diyl)bis(methylene)] ester (e.g. SR833S, commercially available from Cray Valley), and polyolefin compound.

Preferably, the polyolefin compound comprises at least one selected from the group consisting of styrene-butadiene-divinylbenzene terpolymer, styrene-butadiene-maleic anhydride terpolymer, vinyl-polybutadiene-urethane oligomer, styrene-butadiene copolymer, hydrogenated styrene-butadiene copolymer, styrene-isoprene copolymer, hydrogenated styrene-isoprene copolymer, hydrogenated styrene-butadiene-divinylbenzene copolymer, butadiene-urethane-methyl methacrylate copolymer, polybutadiene, maleic anhydride styrene-butadiene copolymer, methyl styrene copolymer, petroleum resin, and cyclic olefin copolymer In one preferred embodiment of the present invention, a number-average molecular weight (Mn) of the specific vinyl compound is less than 1000. For example, the specific vinyl compound includes at least one selected from the group consisting of DVB, BVBE, TAIC, TAC, TVCH, and diallyl bisphenol A.

In one preferred embodiment, the maleimide is monofunctional maleimide, bifunctional maleimide or multifunctional maleimide, but not limited thereto. Any maleimide commonly used by the manufacturer is included in the scope of the aforesaid maleimide. For example, the maleimide may include at least one selected from the group consisting of 4,4'-diphenylmethane bismaleimide, oligomer of phenylmethane maleimide, m-phenylene bismaleimide, bisphenol A diphenyl ether bismaleimide, 3,3'-dimethyl-5,5'-diethyl-4,4'-diphenylmethane bismaleimide, 4-methyl-1,3-phenylene bismaleimide and 1,6-bismaleimide-(2,2,4-trimethyl) hexane.

In one preferred embodiment of the present invention provides a resin composition which includes 15 to 60 parts by weight of a specific phosphorus-containing salt and 100 parts by weight of a prepolymer of vinyl-containing polyphenylene ether.

In one preferred embodiment of the present invention provides a resin composition which includes 20 to 50 parts by weight of a specific phosphorus-containing salt and 100 parts by weight of a prepolymer of vinyl-containing polyphenylene ether.

Preferably, the resin composition further includes an additive, and the additive includes at least one component selected from a group consisting of flame retardant, inorganic filler, polyolefin, curing accelerator, solvent, and surfactant or a combination of any of the above materials.

The aforementioned flame retardant may be a compound having flame retardancy or a compound with a functional group that has flame retardancy, such as phosphorus-containing compounds and nitrogen-containing compounds. The applicable phosphorus-containing compounds may include bisphenol diphenyl phosphate, ammonium polyphosphate, hydroquinone bis-(diphenyl phosphate), bisphenol A bis-(diphenylphosphate), tri(2-carboxyethyl)phosphine (TCEP), tris(chloroisopropyl) phosphate, trimethyl phosphate (TMP), dimethyl methyl phosphonate (DMMP), resorcinol bis(dixylenyl phosphate) (RDXP, e.g., PX-200, purchased from Daihachi), phosphazene (e.g., SPB-100, purchased from Otsuka Chemical), m-phenylene methylphosphonate (PMP), melamine polyphosphate, 9,10-dihydro-9-oxa-10-phosphaphenanthrene-10-oxide (DOPO), DOPO-containing phenol resin (e.g., DOPO-HQ-containing resin and DOPO-containing novolac (DOPO-PN resin)), DOPO-containing bisphenol resin (DOPO-BPN resin), DOPO-containing epoxy resin, DOPO-HQ-containing epoxy resin, diphenylphosphine oxide (DPPO), or derivatives of diphenylphosphine oxide, but not limited thereto. Wherein the DOPO-BPN resin may be bisphenol novolac compounds such as DOPO-bisphenol A novolac (DOPO-BPAN), DOPO-bisphenol F novolac (DOPO-BPFN), and DOPO-bisphenol S novolac (DOPO-BPSN). The applicable nitrogen-containing compound may be amino triazine novolac (ATN), melamine cyanurate, trihydroxy ethyl isocyanurate, or a combination thereof, but not limited thereto. The applicable bromine-containing compounds may include tetrabromobisphenol A (TBBPA), tetrabromocyclohexane, hexabromocyclodecane, 2,4,6-tris(tribromophenoxy)-1,3,5-triazine, decabromodiphenyl ethane (DBDPE), but not limited thereto.

The aforementioned curing accelerator may improve the reaction rate of the resin composition. Preferably, the curing accelerator may include a Lewis base, a Lewis acid or peroxide. The applicable Lewis base may include one of imidazole, a boron trifluoride-amine complex, ethyltriphenylphosphonium chloride, 2-methylimidazole (2MI), 2-phenyl-1H-imidazole (2PZ), 2-ethyl-4-methylimidazole (2E4MI), triphenylphosphine (TPP) and 4-dimethylaminopyridine (DMAP), or a combination thereof. The applicable Lewis acid may include metal salts, e.g., the salt compounds of manganese, iron, cobalt, nickel, copper and zinc (such as zinc octoate and cobalt octoate). The applicable peroxide may include dicumyl peroxide, t-butyl peroxybenzoate, or di(tert-butylperoxyisopropyl)benzene, but not limited thereto. More preferably, the curing accelerator may be di(tert-butylperoxyisopropyl)benzene.

The aforementioned inorganic filler includes silica (with fused state, non-fused state, porous type or hollow), alumina, aluminum hydroxide, magnesia, magnesium hydroxide, calcium carbonate, aluminum nitride, boron nitride, aluminum silicon carbide, silicon carbide, titanium dioxide, zinc oxide, zirconia, mica, boehmite (AlOOH), calcination talc, talc, silicon nitride, calcination kaolin, or a combination thereof. Preferably, the inorganic filler may be spherical, fibrous, plate-shaped, granular, sheet-shaped or acicular, and may be optionally pretreated via a silane coupling agent (e.g., silane or siloxane). Preferably, the particle size of the inorganic filler is 100 micrometers (μm) or less; more preferably ranges from 1 nanometer (nm) to 20 μm; and even more preferably ranging in a being nanometer scale that is greater than or equal to 10 nm and less than 1 μm. Preferably, if the amount of the prepolymer of vinyl-containing polyphenylene ether is 100 parts by weight, the usage amount of the inorganic filler ranges from 10 parts by weight to 200 parts by weight.

The aforementioned surfactant may include silane or siloxane. Preferably, if the amount of the inorganic filler is 100 parts by weight, the usage amount of the surfactant ranges from 0.1 parts by weight to 10 parts by weight. Accordingly, the surfactant may ensure the inorganic filler to be uniformly dispersed in the resin composition. As such, the resin composition may have better thermal conductivity and drilling performance.

The aforementioned polyolefin includes styrene-butadiene-divinylbenzene terpolymer, styrene-butadiene-maleic anhydride terpolymer, vinyl-polybutadiene-urethane oligomer, styrene-butadiene copolymer, hydrogenated styrene-butadiene copolymer, styrene-isoprene copolymer, hydrogenated styrene-isoprene copolymer, or a combination thereof. Preferably, the polyolefin may be styrene-butadiene-divinylbenzene terpolymer, styrene-butadiene-maleic anhydride terpolymer, vinyl-polybutadiene-urethane oligomer, or a combination thereof. Preferably, if the amount of the prepolymer of vinyl-containing polyphenylene ether is 100 parts by weight, the usage amount of the polyolefin ranges from 5 parts by weight to 55 parts by weight. Accordingly, the resin composition having the polyolefin may remain to have low dielectric constant and low dissipation factor.

Another embodiment of the present invention provides a resin film made from the aforesaid resin composition.

Another embodiment of the present invention provides a prepreg made from the aforesaid resin composition.

Another embodiment of the present invention provides a copper-clad laminate made from the aforesaid prepreg or resin film or their combination.

Another embodiment of the present invention provides a printed circuit board which includes the aforesaid copper-clad laminate.

In addition, the present invention provides a product which includes a layered material formed by curing the aforementioned resin composition to become semi-cured (i.e., B-staged), and the suitable curing temperature ranges from 80° C. to 170° C. Specifically, the product may be a prepreg having a reinforcing material and a layered material disposed on the reinforcing material, wherein the layered material is formed by curing the aforementioned resin composition undergoing a high temperature heating process to become semi-cured (i.e., B-staged). The baking temperature for manufacturing the prepreg ranges from 80° C. to 170° C. The reinforcing material includes a fibrous material, a woven fabric or a non-woven fabric, such as a glass fiber fabric, so as to increase the mechanical strength of the prepreg. Preferably, the reinforcing material may be optionally pretreated via a silane coupling agent. The product may further be a rein film, which is made from the semi-cured resin composition through being heated and baked. The resin composition may be selectively coated to a polyethylene terephthalate film (PET film), a polyimide film or a resin coated copper (RCC), followed by baking to become semi-cured (i.e., B-staged), so as to form the resin film.

In addition, the product may further be a laminate including two metal foils and one insulating layer (e.g., the aforementioned layered material). The insulating layer is disposed between the two metal foils, and may be formed by curing the aforementioned resin composition under high temperature and high pressure to become fully-cured (i.e., C-staged). The suitable curing temperature ranges from 150° C. to 230° C. The insulating layer may be the aforementioned prepreg or resin film. The material of the metal foils may be copper, aluminum, nickel, platinum, silver, gold or an alloy of any of the above-mentioned material, such as copper foil.

Preferably, the laminate is a copper-clad laminate. Preferably, the aforementioned laminate may be further treated by a wiring process to form a printed circuit board.

According to the present invention, the copper-clad laminate made from the resin composition of the present invention has the following properties: Tg (measured by DMA)≥190° C., meaning that Tg is equal to or higher than 190° C.; Dimension change (measured by TMA): ≤3.0%, T288>70 minutes, S/D>20 cycles, wherein Dimension change, T288 and S/D are defined below; Df@10 GHz≤0.0060, meaning that Df in 10 GHz frequency testing is equal to or lower than 0.006; and UL 94: V-0, wherein UL 94 is defined below.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The FIGURE shows a FTIR spectrum of a specific phosphorus-containing salt (formula (II)) according to the present invention.

DETAILED DESCRIPTION

In order to verify the characteristics of the resin composition, embodiments of the present invention are listed below. Those skilled in this art may easily understand the benefits and effects that can be achieved with the present invention via the content of this specification, and may make various modifications without departing from the spirit of the invention.

The chemicals for use in the manufacturing examples, embodiments, and comparisons are as follows:
1. Flame Retardant A: as shown in the FIGURE. The FIGURE shows a FTIR spectrum of a specific phosphorus-containing salt (formula (II)) according to the present invention, revealing peaks indicative of, a P=O at 1231.37 cm$^{-1}$ and a P—O-Ph at 924.11 cm$^{-1}$ of the FTIR spectrum (Ph means phenyl), thereby proving the presence of the specific phosphorus-containing salt (formula (II)) of the present invention.
2. OP-935: Diethylphosphinic acid, aluminium salt, purchased from Clariant.
3. SPB-100: phosphazene, purchased from Otsuka Chemical.
4. PX-202: 4, 4'-biphenyl bis(phosphodiesterase-(2,6-dimethylphenyl)ester), purchased from Japan Daihachi Chemical.
5. XZ92741: 9, 10-Dihydro-9-oxa-10-phosphaphenanthrene 10-Oxide (DOPO)-containing phenolic resin as a flame retardant, purchased from Dow Chemical.
6. SA-9000: methacrylate polyphenylene ether resin, purchased from Sabic.
7. OPE-2st 2200: vinylbenzyl polyphenylene ether resin, purchased from Mitsubishi Gas Chemical.
8. TAIC: triallyl isocyanurate, purchased from Kingyorker Enterprise Co. Ltd.
9. TVCH: 1,2,4-trivinylcyclohexane, purchased from SIGMA-ALDRICH.
10. Trilene 67: Liquid Ethylene-Propylene-Diene Monomer (EPDM), purchased from Lion Copolymer.
11. Ricon 100: butadiene-styrene copolymer, purchased from Cray Valley.
12. D-1118: butadiene-styrene copolymer, purchased from Kraton.
13. Ricon 156: polybutadiene, homopolymer of butadiene, purchased from Cray Valley.
14. BMI-70: bis(3-ethyl-5-methyl-4-phenyl maleimide phenyl) methane, purchased from KI Chemical.
15. KI-80: 2,2'-bis[4-(4-maleimidophenoxy)phenyl] propane, purchased from KI Chemical.
16. BMI-5100: 3, 3'-dimethyl-5,5'-diethyl-4, 4'-diphenyl-methane-bismaleimide, purchased from Daiwa kasei.
17. 25B: 2,5-dimethyl-2,5-di(tert-butylperoxy)-3-hexyne, purchased from Nippon Oil & Fats Co., Ltd.
18. BPO: Benzoyl peroxide, purchased from SIGMA-ALDRICH.
19. AIBN: 2,2'-Azobis(2-methylpropionitrile), purchased from SIGMA-ALDRICH.
20. SC-2500 SV: spherical silica, purchased from Admatechs.

Various aspects of the present invention are described in detail below.

In the following, two prepolymerization processes of the present invention, Prepolymerization Process 1 and Prepolymerization Process 2, and two traditional prepolymerization processes, Comparison Prepolymerization Process 1 and Comparison Prepolymerization Process 2, are introduced.

Comparison Prepolymerization Process 1

First, add solid-state PPE (e.g., OPE-2st 2200) into toluene. Then, stir the mixture of PPE and toluene adequately. After PPE is completely dissolved in toluene, add BMI (e.g., BMI-5100) into the mixture and stir the mixture adequately. Next, add peroxide into the mixture. Then, heat the mixture to carry out a prepolymerization reaction such that a prepolymer solution is obtained. After allowing the solution to stand undisturbed for about 1 day, a white precipitate is appeared at the bottom. The white precipitate is precipitated BMI.

Comparison Prepolymerization Process 2

First, add solid-state PPE (e.g., OPE-2st 2200) into TAIC. Then, stir the mixture of PPE and TAIC adequately. After PPE is completely dissolved in TAIC, add BMI (e.g., BMI-5100) into the mixture and stir the mixture adequately. Next, add peroxide into the mixture. Then, heat the mixture to carry out a prepolymerization reaction such that a prepolymer solution is obtained. After allowing the solution to stand undisturbed for about 1 day, a white precipitate is appeared at the bottom. The white precipitate is precipitated BMI.

Prepolymerization Process 1

First, add solid-state BMI (e.g., BMI-5100) into TAIC in the absence of other solvents. Then, stir the mixture of BMI and TAIC adequately. After BMI is completely dissolved in TAIC, add toluene and gamma-Butyrolactone (i.e., GBL) into the mixture followed by adding PPE (e.g., OPE-2st 2200) into the mixture. Next, add peroxide into the mixture. Sequentially, heat the mixture to carry out a prepolymerization reaction such that a solution containing prepolymerized vinyl-containing polyphenylene ether is obtained. After allowing the solution to stand undisturbed for about 1 day, no precipitate is appeared at the bottom. Thus, the BMI is not precipitated.

Prepolymerization Process 2

First, add solid-state BMI (e.g., BMI-5100) into TAIC in the absence of other solvents. Then, stir the mixture of BMI and TAIC adequately. After, BMI is completely dissolved in TAIC, add toluene and GBL into the mixture followed by adding PPE (e.g., OPE-2st 2200) and polybutadiene into the mixture. Next, add peroxide into the mixture. Sequentially, heat the mixture to carry out a prepolymerization reaction such that a solution of prepolymerized vinyl-containing polyphenylene ether is obtained. After allowing the solution to stand undisturbed for about 1 day, no precipitate is appeared at the bottom. Thus, the BMI is not precipitated.

Manufacturing Example 1

Add 15 g of KI-80 into 40 g of TVCH. Then, stir the mixture of KI-80 and TVCH adequately. After KI-80 is completely dissolved in TVCH, add 500 g of toluene and 20 g of GBL into the mixture followed by adding 60 g of SA-9000 into the mixture. Stir the mixture adequately. Next, add 0.15 g of 2,2'-Azobis (2-methylpropionitrile) (AIBN) into the mixture. Then, heat the mixture up to 90° C. for 8 hours to carry out a prepolymerization reaction such that a solution of prepolymerized vinyl-containing polyphenylene ether is obtained. Vacuum dry the solution to remove the solvent. As such, a prepolymer of vinyl-containing polyphenylene ether is obtained.

Manufacturing Example 2

Add 15 g of BMI-5100 into 40 g of TAIC. Then, stir the mixture of BMI-5100 and TAIC adequately. After BMI-5100 is completely dissolved in TAIC, add 500 g of toluene and 20 g of GBL into the mixture followed by adding 60 g of OPE-2st 2200 into the mixture. Next, add log of Ricon 156 and then 0.15 g of BPO into the mixture. Sequentially, heat the mixture up to 90° C. for 8 hours to carry out a prepolymerization reaction such that a solution of prepolymerized vinyl-containing polyphenylene ether is obtained. Vacuum dry the solution to remove the solvent. Accordingly, a prepolymer of vinyl-containing polyphenylene ether (hereinafter denoted as polymer A) is obtained.

Objectives, features, and advantages of the present invention are hereunder illustrated with specific embodiments:

Embodiment 1 (E1)

A resin composition, comprising ingredients as follows:
(A) 25 parts by weight of flame retardant A;
(B) 100 parts by weight of polymer A;
(C) 1 parts by weight of 25B;
(D) 70 parts by weight of SC-2500 SV;
(E) 50 parts by weight of toluene; and
(F) 40 parts by weight of butanone (i.e., methyl ethyl ketone, MEK).

Embodiment 2 (E2)

A resin composition, comprising ingredients as follows:
(A) 30 parts by weight of flame retardant A;
(B) 100 parts by weight of polymer A;
(C) 10 parts by weight of BMI-70;
(D) 1 parts by weight of 25B;
(E) 70 parts by weight of SC-2500 SV;
(F) 50 parts by weight of toluene; and
(G) 40 parts by weight of butanone.

Embodiment 3 (E3)

A resin composition, comprising ingredients as follows:
(A) 25 parts by weight of flame retardant A;
(B) 100 parts by weight of polymer A;
(C) 1 parts by weight of 25B;
(D) 70 parts by weight of SC-2500 SV;
(E) 100 parts by weight of toluene; and
(F) 30 parts by weight of butanone.

Embodiment 4 (E4)

A resin composition, comprising ingredients as follows:
(A) 50 parts by weight of flame retardant A;
(B) 100 parts by weight of polymer A;
(C) 5 parts by weight of trilene 67;
(D) 30 parts by weight of Ricon 100;
(E) 10 parts by weight of D-1118;
(F) 30 parts by weight of BMI-70;
(G) 1 parts by weight of 25B;
(H) 70 parts by weight of SC-2500 SV;
(I) 100 parts by weight of toluene; and
(J) 30 parts by weight of butanone.

Embodiment 5 (E5)

A resin composition, comprising ingredients as follows:
(A) 40 parts by weight of flame retardant A;
(B) 100 parts by weight of polymer A;
(C) 5 parts by weight of trilene 67;
(D) 50 parts by weight of Ricon 100;
(E) 1 parts by weight of 25B;
(F) 70 parts by weight of SC-2500 SV;
(G) 100 parts by weight of toluene; and
(H) 30 parts by weight of butanone.

Embodiment 6 (E6)

A resin composition, comprising ingredients as follows:
(A) 60 parts by weight of flame retardant A;
(B) 100 parts by weight of polymer A;
(C) 10 parts by weight of trilene 67;

(D) 15 parts by weight of Ricon 100;
(E) 40 parts by weight of D-1118;
(F) 50 parts by weight of BMI-70;
(G) 1 parts by weight of 25B;
(H) 70 parts by weight of SC-2500 SV;
(I) 100 parts by weight of toluene; and
(J) 30 parts by weight of butanone.

Embodiment 7 (E7)

A resin composition, comprising ingredients as follows:
(A) 20 parts by weight of flame retardant A;
(B) 30 parts by weight of PX-202;
(C) 100 parts by weight of polymer A;
(D) 5 parts by weight of trilene 67;
(E) 30 parts by weight of Ricon 100;
(F) 10 parts by weight of D-1118;
(G) 30 parts by weight of BMI-70;
(H) 1 parts by weight of 25B;
(I) 70 parts by weight of SC-2500 SV;
(J) 100 parts by weight of toluene; and
(K) 30 parts by weight of butanone.

Embodiment 8 (E8)

A resin composition, comprising ingredients as follows:
(A) 15 parts by weight of flame retardant A;
(B) 20 parts by weight of PX-202;
(C) 100 parts by weight of polymer A;
(D) 1 parts by weight of 25B;
(E) 70 parts by weight of SC-2500 SV;
(F) 100 parts by weight of toluene; and
(G) 30 parts by weight of butanone.

Embodiment 9 (E9)

A resin composition, comprising ingredients as follows:
(A) 45 parts by weight of flame retardant A;
(B) 100 parts by weight of polymer A;
(C) 5 parts by weight of trilene 67;
(D) 20 parts by weight of Ricon 100;
(E) 5 parts by weight of D-1118;
(F) 15 parts by weight of BMI-70;
(G) 1 parts by weight of 25B;
(H) 70 parts by weight of SC-2500 SV;
(I) 100 parts by weight of toluene; and
(J) 30 parts by weight of butanone.

Comparison 1 (C1)

A resin composition, comprising ingredients as follows:
(A) 25 parts by weight of OP-935;
(B) 100 parts by weight of OPE-2st 2200;
(C) 1 parts by weight of 25B;
(D) 70 parts by weight of SC-2500 SV;
(E) 50 parts by weight of toluene; and
(F) 40 parts by weight of butanone.

Comparison 2 (C2)

A resin composition, comprising ingredients as follows:
(A) 25 parts by weight of Flame Retardant A;
(B) 100 parts by weight of OPE-2st 2200;
(C) 1 parts by weight of 25B;
(D) 70 parts by weight of SC-2500 SV;
(E) 50 parts by weight of toluene; and
(F) 40 parts by weight of butanone.

Comparison 3 (C3)

A resin composition, comprising ingredients as follows:
(A) 25 parts by weight of PX-202;
(B) 100 parts by weight of polymer A;
(C) 1 parts by weight of 25B;
(D) 70 parts by weight of SC-2500 SV;
(E) 50 parts by weight of toluene; and
(F) 40 parts by weight of butanone.

Comparison 4 (C4)

A resin composition, comprising ingredients as follows:
(A) 75 parts by weight of PX-202;
(B) 100 parts by weight of polymer A;
(C) 1 parts by weight of 25B;
(D) 70 parts by weight of SC-2500 SV;
(E) 50 parts by weight of toluene; and
(F) 40 parts by weight of butanone.

Comparison 5 (C5)

A resin composition, comprising ingredients as follows:
(A) 25 parts by weight of XZ92741;
(B) 100 parts by weight of polymer A;
(C) 1 parts by weight of 25B;
(D) 70 parts by weight of SC-2500 SV;
(E) 50 parts by weight of toluene; and
(F) 40 parts by weight of butanone.

Comparison 6 (C6)

A resin composition, comprising ingredients as follows:
(A) 25 parts by weight of SPB-100;
(B) 100 parts by weight of polymer A;
(C) 1 parts by weight of 25B;
(D) 70 parts by weight of SC-2500 SV;
(E) 50 parts by weight of toluene; and
(F) 40 parts by weight of butanone.

Comparison 7 (C7)

A resin composition, comprising ingredients as follows:
(A) 25 parts by weight of OP-935;
(B) 100 parts by weight of polymer A;
(C) 1 parts by weight of 25B;
(D) 70 parts by weight of SC-2500 SV;
(E) 50 parts by weight of toluene; and
(F) 40 parts by weight of butanone.

Comparison 8 (C8)

A resin composition, comprising ingredients as follows:
(A) 25 parts by weight of Flame Retardant A;
(B) 100 parts by weight of SA-9000;
(C) 1 parts by weight of 25B;
(D) 70 parts by weight of SC-2500 SV;
(E) 50 parts by weight of toluene; and
(F) 40 parts by weight of butanone.

Comparison 9 (C9)

A resin composition, comprising ingredients as follows:
(A) 25 parts by weight of SPB-100;
(B) 100 parts by weight of SA-9000;

(C) 1 parts by weight of 25B;
(D) 70 parts by weight of SC-2500 SV;
(E) 50 parts by weight of toluene; and
(F) 40 parts by weight of butanone.

Comparison 10 (C10)

A resin composition, comprising ingredients as follows:
(A) 30 parts by weight of OP-935;
(B) 100 parts by weight of SA-9000;
(C) 10 parts by weight of BMI-70;
(D) 1 parts by weight of 25B;
(E) 70 parts by weight of SC-2500 SV;
(F) 50 parts by weight of toluene; and
(G) 40 parts by weight of butanone.

Comparison 11 (C11)

A resin composition, comprising ingredients as follows:
(A) 25 parts by weight of OP-935;
(B) 100 parts by weight of SA-9000;
(C) 1 parts by weight of 25B;
(D) 70 parts by weight of SC-2500 SV;
(E) 50 parts by weight of toluene; and
(F) 40 parts by weight of butanone.

Comparison 12 (C12)

A resin composition, comprising ingredients as follows:
(A) 45 parts by weight of OP-935;
(B) 100 parts by weight of polymer A;
(C) 5 parts by weight of trilene 67;
(D) 30 parts by weight of Ricon 100;
(E) 10 parts by weight of D-1118;
(F) 30 parts by weight of BMI-70;
(G) 1 parts by weight of 25B;
(H) 70 parts by weight of SC-2500 SV;
(I) 100 parts by weight of toluene; and
(J) 30 parts by weight of butanone.

Comparison 13 (C13)

A resin composition, comprising ingredients as follows:
(A) 70 parts by weight of Flame Retardant A;
(B) 100 parts by weight of polymer A;
(C) 10 parts by weight of trilene 67;
(D) 15 parts by weight of Ricon 100;
(E) 40 parts by weight of D-1118;
(F) 50 parts by weight of BMI-70;
(G) 1 parts by weight of 25B;
(H) 70 parts by weight of SC-2500 SV;
(I) 100 parts by weight of toluene; and
(J) 30 parts by weight of butanone.

Comparison 14 (C14)

A resin composition, comprising ingredients as follows:
(A) 10 parts by weight of Flame Retardant A;
(B) 100 parts by weight of polymer A;
(C) 1 parts by weight of 25B;
(D) 70 parts by weight of SC-2500 SV;
(E) 100 parts by weight of toluene; and
(F) 30 parts by weight of butanone.

Comparison 15 (C15)

A resin composition, comprising ingredients as follows:
(A) 60 parts by weight of SPB-100;
(B) 100 parts by weight of polymer A;
(C) 10 parts by weight of trilene 67;
(D) 15 parts by weight of Ricon 100;
(E) 40 parts by weight of D-1118;
(F) 50 parts by weight of BMI-70;
(G) 1 parts by weight of 25B;
(H) 70 parts by weight of SC-2500 SV;
(I) 100 parts by weight of toluene; and
(J) 30 parts by weight of butanone.

Comparison 16 (C16)

A resin composition, comprising ingredients as follows:
(A) 60 parts by weight of PX-202;
(B) 100 parts by weight of polymer A;
(C) 10 parts by weight of trilene 67;
(D) 15 parts by weight of Ricon 100;
(E) 40 parts by weight of D-1118;
(F) 50 parts by weight of BMI-70;
(G) 1 parts by weight of 25B;
(H) 70 parts by weight of SC-2500 SV;
(I) 100 parts by weight of toluene; and
(J) 30 parts by weight of butanone.

Comparison 17 (C17)

A resin composition, comprising ingredients as follows:
(A) 60 parts by weight of XZ92741;
(B) 100 parts by weight of polymer A;
(C) 10 parts by weight of trilene 67;
(D) 15 parts by weight of Ricon 100;
(E) 40 parts by weight of D-1118;
(F) 50 parts by weight of BMI-70;
(G) 1 parts by weight of 25B;
(H) 70 parts by weight of SC-2500 SV;
(I) 100 parts by weight of toluene; and
(J) 30 parts by weight of butanone.

Ingredients of the resin composition in embodiments 1 to 9 are enumerated in Table 1. Ingredients of the resin composition in comparisons 1 to 17 are enumerated in Table 3. The ingredients of the resin composition in embodiments 1 to 9 and comparisons 1 to 17 are evenly mixed in a blender by batch before being put into an impregnation tank respectively. Then, a glass fiber fabric (E-glass fiber fabric, 2116 type) is passed through the impregnation tank to allow the resin composition to adhere to the glass fiber fabric before undergoing a heating and baking (about 150° C.) process to become semi-cured (i.e., B-staged), thereby forming a prepreg. The resin content of each prepreg is about 55%. A piece of 18-μm copper foil, four pieces of the prepreg prepared by the same batch, and another piece of 18-μm copper foil are stacked in sequence before being laminated against each other in vacuum at 200° C. for two hours to form a copper-clad laminate, wherein, the four pieces of prepreg are fully cured (i.e., C-staged) to form an insulating layer between the two copper foils.

Preparation of the Test Samples for Property Analysis:
1. Copper-Clad Laminate (Four Layers):
Two pieces of copper foils with a thickness of 18 μm and four pieces of the prepregs manufactured from each test sample are supplied. The content of the resin of each prepreg is about 55%. The copper foil, four pieces of prepregs and copper foil are stacked in sequence before being laminated against each under vacuum and at 210° C. for two hours to form a copper-clad laminate. Wherein, the four pieces of prepregs stacked on each other are cured to form an insulating layer between the two copper foils, and the content of the resin of the insulating layer is about 55%.

2. Copper-Free Laminate (Four Layers):
Perform an etching process to the aforementioned copper-clad laminate (four layers) for removing the two copper foils to obtain a copper-free laminate (four layers). Wherein the copper-free laminate (four layers) are formed with four pieces of laminated prepregs, and the content of the resin of the copper-free laminate (four layers) is about 55%.

3. Copper-Free Laminate (Two Layers):
Two pieces of copper foils with a thickness of 18 μm and two pieces of the prepregs manufactured from each test sample are supplied. The content of the resin of each prepreg is about 55%. The copper foil, two pieces of prepregs and copper foil are stacked in sequence before being laminated against each other under vacuum and at 210° C. for two hours to form a double layered copper-clad laminate. Next, perform an etching process to the double layered copper-clad laminate for removing the two copper foils to obtain a copper-free laminate (two layers). The insulating layer is laminated by two pieces of prepregs, and the content of the resin of the copper-free laminate (two layers) is about 55%.

The property analysis items and testing process is explained below:

1. Thermal Expansion (Dimension Change Ratio of Z-Axis):
To measure the thermal expansion, the above-mentioned copper-free laminate (four layers) is used as the test sample. The dimension change ratio of each test sample is measured by a thermal mechanical analyzer (TMA) according to IPC-TM-650 2.4.24c test method in the temperature range by heating from 50° C. to 260° C., wherein the unit is % and low percent of thermal expansion is preferred.

2. Heat Resistance (T288):
To measure the heat resistance, the above-mentioned copper-clad laminate (four layers) with a size of 6.5 mm×6.5 mm is used as the test sample. The heat resistance is measured by TMA, in which the duration of a copper-clad laminate sustaining heat under a constant temperature of 288° C. without rupture or delamination is recorded, according to IPC-TM-650 2.4.24.1 test method. The longer duration represents the heat resistance of the copper-clad laminate made from the resin composition is better.

3. Dissipation Factor:
To measure the dissipation factor, the above-mentioned copper-free laminate (double layers) is used as the test sample. The dissipation factor of each test sample is measured at 10 GHz under room temperature by a microwave dielectrometer (purchased from AET) according to JIS C2565 test method, wherein a lower dissipation factor (Df) is preferred and represent the test sample has a better dissipation factor performance. The Df difference less than 0.0005 indicates there is no obvious difference of dissipation factor between the laminates of different samples, and the Df difference greater than 0.0005 indicates there is a significant difference between laminates of different samples.

4. Flame Retardancy:
In the flame retardancy test, the above-mentioned copper-free laminate (four layers) with a size of 125 mm×13 mm is selected as the test sample. The flame retardancy test is performed according to standard UL94 test method, and the analysis results are illustrated in the rankings V-0, V-1, and V-2, wherein the ranking V-0 is superior to V-1, V-1 is superior to V-2, and burn out is the worst.

5. Glass Transition Temperature (Tg):
To measure the glass transition temperature, the above-mentioned copper-free laminate (four layers) is selected as the test sample. The glass transition temperature of each test sample is measured by a dynamic mechanical analysis (DMA) according to IPC-TM-650 2.4.24.4 test method.

6. Solder Dipping (S/D) Test:
In the solder dipping test, the above-mentioned copper-clad laminate (four layers) is selected as the test sample. To dip each test sample into a solder bath with a constant temperature of 288° C. for 10 seconds is regarded as one cycle. Measure the total heat resistance cycle without board rupture or delamination of each test sample, according to IPC-TM-650 2.4.23 test method.

The results of measurement of the resin composition in embodiments 1 to 9 are enumerated in Table 2. The results of measurement of the resin composition in comparisons 1 to 17 are enumerated in Table 4.

TABLE 1

Ingredients of The Resin Composition in Embodiments 1~9

| | Ingredient | | E1 | E2 | E3 | E4 | E5 | E6 | E7 | E8 | E9 |
|---|---|---|---|---|---|---|---|---|---|---|---|
| Flame Retardant | Flame Retardant A Diethylphosphinic acid, aluminium salt | Flame Retardant A OP-935 | 25 | 30 | 25 | 50 | 40 | 60 | 20 | 15 | 45 |
| | phosphazene compound | SPB-100 | | | | | | | | | |
| | 4,4'-biphenyl bis(phospho-diesterase-(2,6-dimethyl-phenyl)ester) | PX-202 | | | | | | | 30 | 20 | |
| | DOPO phenolic flame retardant | XZ92741 | | | | | | | | | |
| vinyl compound | prepolymer of vinyl-containing polyphenylene ether | Polymer A | 100 | 100 | 100 | 100 | 100 | 100 | 100 | 100 | 100 |
| | methacrylate polyphenylene ether resin | SA-9000 | | | | | | | | | |
| | vinyl benzyl ether polyphenylene ether resin | OPE-2st 2200 | | | | | | | | | |

TABLE 1-continued

Ingredients of The Resin Composition in Embodiments 1~9

| | Ingredient | | E1 | E2 | E3 | E4 | E5 | E6 | E7 | E8 | E9 |
|---|---|---|---|---|---|---|---|---|---|---|---|
| | Liquid Ethylene-Propylene-Diene Monomer | Trilene 67 | | | | 5 | 5 | 10 | 5 | | 5 |
| | butadiene-styrene copolymer | Ricon100 | | | | 30 | 50 | 15 | 30 | | 20 |
| | butadiene-styrene copolymer | D-1118 | | | | 10 | | 40 | 10 | | 5 |
| | bis(3-ethyl-5-methyl-4-phenyl maleimide phenyl) methane | BMI-70 | | 10 | | 30 | | 50 | 30 | | 15 |
| peroxide | peroxide | 25B | 1 | 1 | 1 | 1 | 1 | 1 | 1 | 1 | 1 |
| Inorganic filler | SC-2500 SV | SC 2500 SV | 70 | 70 | 70 | 70 | 70 | 70 | 70 | 70 | 70 |
| solvent | toluene | | 50 | 50 | 100 | 100 | 100 | 100 | 100 | 100 | 100 |
| | butanone | | 40 | 40 | 30 | 30 | 30 | 30 | 30 | 30 | 30 |

TABLE 2

Results of Measurement of The Resin Composition in Embodiments 1~9

| property | Method (unit) | E1 | E2 | E3 | E4 | E5 | E6 | E7 | E8 | E9 |
|---|---|---|---|---|---|---|---|---|---|---|
| Tg | DMA (° C.) | 201 | 201 | 201 | 205 | 190 | 209 | 199 | 195 | 203 |
| Dimension change ratio | TMA (%) | 2.26 | 2.22 | 2.26 | 2.29 | 2.86 | 2.43 | 2.49 | 2.53 | 2.23 |
| T288 (clad) | TMA (min) | >70 | >70 | >70 | >70 | >70 | >70 | >70 | >70 | >70 |
| S/D | (dip cycles) | >20 | >20 | >20 | >20 | >20 | >20 | >20 | >20 | >20 |
| Df | 10 GHz | 0.0055 | 0.0057 | 0.0055 | 0.0054 | 0.0051 | 0.0058 | 0.0057 | 0.0059 | 0.0051 |
| Flame test | UL94 | V-0 | V-0 | V-0 | V-0 | V-0 | V-0 | V-0 | V-0 | V-0 |

TABLE 3

Ingredients of The Resin Composition in Comparisons 1~9

| | ingredient | | C1 | C2 | C3 | C4 | C5 | C6 | C7 | C8 | C9 |
|---|---|---|---|---|---|---|---|---|---|---|---|
| Flame Retardant | Flame Retardant A | Flame Retardant A | | 25 | | | | | | 25 | |
| | Diethylphosphinic acid, aluminium salt | OP-935 | 25 | | | | | | 25 | | |
| | phosphazene compound | SPB-100 | | | | | | 25 | | | 25 |
| | 4,4'-biphenyl bis(phosphodi-esterase-(2,6-dimethylphenyl)ester) | PX-202 | | | 25 | 75 | | | | | |
| | DOPO phenolic flame retardant | XZ92741 | | | | | 25 | | | | |
| vinyl compound | prepolymer of vinyl-containing polyphenylene ether | Polymer A | | | 100 | 100 | 100 | 100 | 100 | | |
| | methacrylate polyphenylene ether resin | SA-9000 | | | | | | | | 100 | 100 |
| | vinyl benzyl ether polyphenylene ether resin | OPE-2st 2200 | 100 | 100 | | | | | | | |
| | Liquid Ethylene-Propylene-Diene Monomer | trilene 67 | | | | | | | | | |
| | butadiene-styrene copolymer | Ricon100 | | | | | | | | | |
| | butadiene-styrene copolymer | D-1118 | | | | | | | | | |
| | bis(3-ethyl-5-methyl-4-phenyl maleimide phenyl) methane | BMI-70 | | | | | | | | | |

TABLE 3-continued

| | | | | | | | | | | | |
|---|---|---|---|---|---|---|---|---|---|---|---|
| peroxide | peroxide | 25B | 1 | 1 | 1 | 1 | 1 | 1 | 1 | 1 | 1 |
| Inorganic filler | SC-2500 SV | SC 2500 SV | 70 | 70 | 70 | 70 | 70 | 70 | 70 | 70 | 70 |
| solvent | toluene | | 50 | 50 | 50 | 50 | 50 | 50 | 50 | 50 | 50 |
| | butanone | | 40 | 40 | 40 | 40 | 40 | 40 | 40 | 40 | 40 |

Ingredients of The Resin Composition in Comparisons 10~17

| | ingredient | | C10 | C11 | C12 | C13 | C14 | C15 | C16 | C17 |
|---|---|---|---|---|---|---|---|---|---|---|
| Flame Retardant | Flame Retardant A | Flame Retardant A | | | | | 70 | 10 | | |
| | Diethylphosphinic acid, aluminium salt | OP-935 | 30 | 25 | 45 | | | | | |
| | phosphazene compound | SPB-100 | | | | | | | 60 | |
| | 4,4'-biphenyl bis(phosphodi-esterase-(2,6-dimethylphenyl)ester) | PX-202 | | | | | | | | 60 |
| | DOPO phenolic flame retardant | XZ92741 | | | | | | | | 60 |
| vinyl compound | prepolymer of vinyl-containing polyphenylene ether | Polymer A | | | 100 | 100 | 100 | 100 | 100 | 100 |
| | methacrylate polyphenylene ether resin | SA-9000 | 100 | 100 | | | | | | |
| | vinyl benzyl ether polyphenylene ether resin | OPE-2st 2200 | | | | | | | | |
| | Liquid Ethylene-Propylene-Diene Monomer | trilene 67 | | | 5 | 10 | | 10 | 10 | 10 |
| | butadiene-styrene copolymer | Ricon100 | | | 30 | 15 | | 15 | 15 | 15 |
| | butadiene-styrene copolymer | D-1118 | | | 10 | 40 | | 40 | 40 | 40 |
| | bis(3-ethyl-5-methyl-4-phenyl maleimide phenyl) methane | BMI-70 | 10 | | 30 | 50 | | 50 | 50 | 50 |
| peroxide | peroxide | 25B | 1 | 1 | 1 | 1 | 1 | 1 | 1 | 1 |
| Inorganic filler | SC-2500 SV | SC 2500 SV | 70 | 70 | 70 | 70 | 70 | 70 | 70 | 70 |
| solvent | toluene | | 50 | 50 | 100 | 100 | 100 | 100 | 100 | 100 |
| | butanone | | 40 | 40 | 30 | 30 | 30 | 30 | 30 | 30 |

TABLE 4

Results of Measurement of The Resin Composition in Comparisons 1~9

| property | Method (unit) | C1 | C2 | C3 | C4 | C5 | C6 | C7 | C8 | C9 |
|---|---|---|---|---|---|---|---|---|---|---|
| Tg | DMA(° C.) | 175 | 179 | 170 | 153 | 182 | 186 | 190 | 203 | 184 |
| Dimension change ratio | TMA(%) | 3.08 | 2.98 | 3.35 | 4.12 | 2.72 | 3.53 | 2.88 | 2.75 | 3.55 |
| T288 (clad) | TMA(min) | 60 | 64 | 30 | 3 | 15 | 55 | 58 | >70 | 65 |
| S/D | (dip cycles) | >20 | 18 | 15 | 5 | 8 | >20 | >20 | >20 | >20 |
| Df | 10 GHz | 0.0072 | 0.0067 | 0.0060 | 0.0074 | 0.0108 | 0.0068 | 0.0065 | 0.0068 | 0.0072 |
| Flame test | UL94 | V-0 | V-0 | V-2 | V-0 | V-1 | V-0 | V-0 | V-0 | V-0 |

Results of Measurement of The Resin Composition in Comparisons 10~17

| property | Method (unit) | C10 | C11 | C12 | C13 | C14 | C15 | C16 | C17 |
|---|---|---|---|---|---|---|---|---|---|
| Tg | DMA(° C.) | 204 | 195 | 190 | 190 | 201 | 185 | 176 | 190 |
| Dimension change ratio | TMA(%) | 2.99 | 3.11 | 2.88 | 2.86 | 2.46 | 3.54 | 3.49 | 2.71 |
| T288 (clad) | TMA(min) | >70 | 30 | 30 | 30 | >70 | 64 | 30 | 7 |
| S/D | (dip cycles) | >20 | 15 | 15 | >20 | >20 | >20 | >20 | 6 |
| Df | 10 GHz | 0.0074 | 0.0070 | 0.0061 | 0.0065 | 0.0054 | 0.0068 | 0.0059 | 0.0123 |
| Flame test | UL94 | V-0 | V-0 | V-0 | V-0 | burn out | V-2 | burn out | V-1 |

Referring to Table 2 and Table 4, an integrated comparison of embodiments E1 to E9 and comparisons C1 to C17 reveals the following.

A comparison of E1 and C1, C2 and C7 proves that the resin composition of E1 having the prepolymer of vinyl-containing polyphenylene ether and specific phosphorus-containing salt manifests preferable Tg, thermal expansion, T288, S/D heat resistance and Df. A comparison of E1 and C3 to C6 having a flame retardant other than the specific phosphorus-containing salt proves that the resin composition of E1 having the specific phosphorus-containing salt manifests preferable Tg, thermal expansion, T288, S/D heat resistance, flame retardancy and Df. Similarly, a comparison of E1 to E2 and C8 to C11 proves that E1 and E2 have preferable properties for a laminate.

A comparison of E6 and C13 proves that when the content of the specific phosphorus-containing salt is greater than 60 parts by weight, the resin composition would have reduced Tg, higher thermal expansion, deteriorated T288 and higher Df. A comparison of E3, E8 and C14 proves that the specific phosphorus-containing salt may be used with other flame retardants so as to gain the ranking V-0 of flame retardancy and other preferable properties for a laminate. However, when the content of the specific phosphorus-containing salt is less than or equal to 10 parts by weight, some unexpected effect will occur, such as higher thermal expansion and deteriorated flame retardancy.

Furthermore, among the embodiments E1 to E9, the laminate manufactured in E9 manifests a relatively low CTE value, a relatively low dimension change of thermal expansion, and relatively satisfactory dielectric properties (such as dissipation factor, Df). Accordingly, the resin composition of embodiments E1 to E9 have superior properties to comparisons C1 to C17, and the embodiment E9 is considered as a more preferred embodiment of the present invention among the embodiments E1 to E9 of the present invention. Hence, the resin composition of the present invention not only improves the flame retardancy, but also significantly enhances laminate heat resistance and achieves preferable dielectric properties.

To sum up, the present invention discloses a resin composition characterized by specific ingredients and proportion required to achieve satisfactory properties of the prepreg made from the resin composition, and attain high heat resistance and satisfactory dielectric properties expected for laminates, such that the resin composition is suitable for use in manufacturing a prepreg or a resin film to thereby enable the resin composition to be applicable to copper-clad laminates and printed circuit boards.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resin composition comprising the following components:

(A) a specific phosphorus-containing salt, being expressed by formula (I) below:

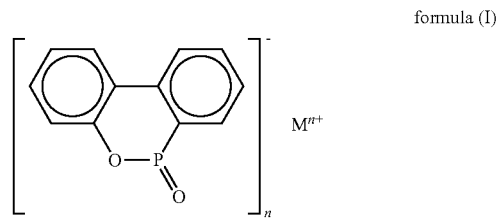

formula (I)

wherein $M^{n+}$ is a metal ion and n denotes an integer from 1 to 3; and (B) a prepolymer of vinyl-containing polyphenylene ether, wherein the prepolymer of vinyl-containing polyphenylene ether is prepolymerized from vinyl-containing polyphenylene ether resin, maleimide, and a specific vinyl compound other than vinyl-containing polyphenylene ether resin and maleimide.

2. The resin composition of claim 1, wherein $M^{n+}$ is a metal ion selected from the group consisting of $Al^{3+}$, $Ca^{2+}$ and $Zn^{2+}$.

3. The resin composition of claim 1, wherein the specific phosphorus-containing salt is expressed by formula (II) below:

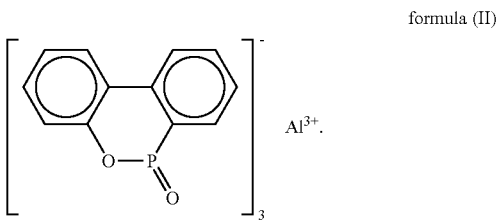

formula (II)

4. The resin composition of claim 1, wherein the vinyl-containing polyphenylene ether resin is a polyphenylene ether resin with at least one end group having an unsaturated double bond.

5. The resin composition of claim 1, wherein the vinyl-containing polyphenylene ether resin is expressed by formula (III) below:

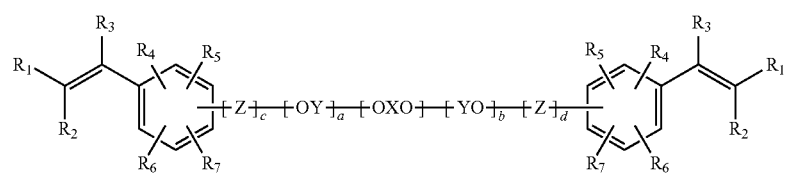

formula (III)

wherein $R_1$ and $R_2$ represent hydrogen atom, $R_3$, $R_4$, $R_5$, $R_6$ and $R_7$ are the same as or different from each other, each independently representing a hydrogen atom or an alkyl group;

—(O—X—O)— represents any one of formula (IV) or (V) expressed below:

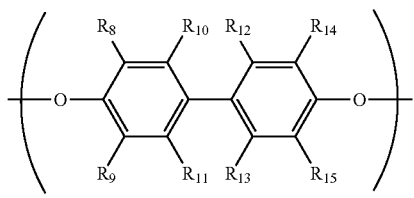

formula (IV)

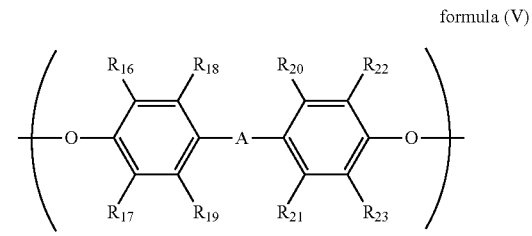

formula (V)

wherein $R_8$, $R_9$, $R_{10}$, $R_{11}$, $R_{12}$, $R_{13}$, $R_{14}$ and $R_{15}$ are the same as or different from each other, each independently representing a hydrogen atom, an alkyl group with 6 or less carbon atoms or a phenyl group, $R_{16}$, $R_{17}$, $R_{18}$, $R_{19}$, $R_{20}$, $R_{21}$, $R_{22}$, and $R_{23}$ are the same as or different from each other, each independently representing a halogen atom, an alkyl group with 6 or less carbon atoms or a phenyl group, and A represents a linear, branched or cyclic hydrocarbon with 20 or less carbon atoms;

—(Y—O)— represents formula (VI) expressed below:

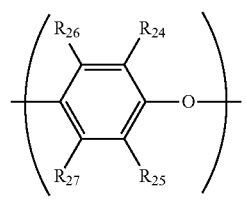

formula (VI)

wherein $R_{24}$, $R_{25}$, $R_{26}$ and $R_{27}$ are the same as or different from each other, each independently representing a hydrogen atom, an alkyl group with 6 or less carbon atoms or a phenyl group;

Z represents an organic group with at least one carbon atom; and a and b independently represent an integer from 1 to 30, and c and d are 1.

6. The resin composition of claim 5, wherein A represents —$CH_2$— or —$C(CH_3)_2$—.

7. The resin composition of claim 5, wherein Z represents an alkyl group with 6 or less carbon atoms.

8. The resin composition of claim 5, wherein Z is a methylene (—$CH_2$—).

9. The resin composition of claim 1, wherein the vinyl-containing polyphenylene ether resin is expressed by formula (VII) below:

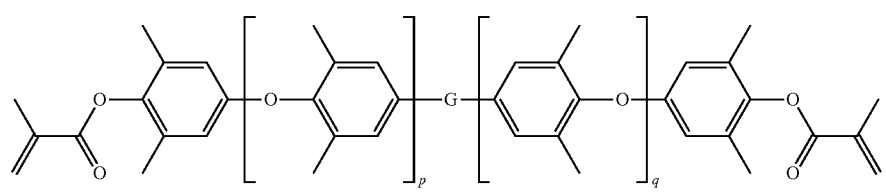

formula (VII)

wherein G is bisphenol A, bisphenol F or a covalent bond, and p and q independently represent an integer of 1 to 15.

10. The resin composition of claim 1, wherein the vinyl-containing polyphenylene ether resin comprises at least one resin selected from the group consisting of methacrylate polyphenylene ether resin and vinylbenzyl polyphenylene ether resin.

11. The resin composition of claim 1, wherein the specific vinyl compound comprises at least one selected from the group consisting of divinylbenzene (DVB), bis(vinylbenzyl) ether (BVBE), triallyl isocyanurate (TAIC), triallyl cyanurate (TAC), 1,2,4-Trivinylcyclohexane (TVCH), diallyl bisphenol A, styrene, brominated styrene, 2-Propenoic acid, 1,1'-[(octahydro-4,7-methano-1H-indene-5,6-diyl)bis(methylene)] ester, and polyolefin compound.

12. The resin composition of claim 11, wherein the polyolefin compound comprises at least one selected from the group consisting of styrene-butadiene-divinylbenzene terpolymer, styrene-butadiene-maleic anhydride terpolymer, vinyl-polybutadiene-urethane oligomer, styrene-butadiene copolymer, hydrogenated styrene-butadiene copolymer, styrene-isoprene copolymer, hydrogenated styrene-isoprene copolymer, hydrogenated styrene-butadiene-divinylbenzene copolymer, butadiene-urethane-methyl methacrylate copolymer, polybutadiene, maleic anhydride styrene-butadiene copolymer, methyl styrene copolymer, petroleum resin, and cyclic olefin copolymer.

13. The resin composition of claim 1, the maleimide is monofunctional maleimide, bifunctional maleimide or multifunctional maleimide.

14. The resin composition of claim 1, the maleimide comprises at least one selected from the group consisting of 4,4'-diphenylmethane bismaleimide, oligomer of phenylmethane maleimide, m-phenylene bismaleimide, bisphenol A diphenyl ether bismaleimide, 3,3'-dimethyl-5,5'-diethyl- 4,4'-diphenylmethane bismaleimide, 4-methyl-1,3-phenylene bismaleimide and 1,6-bismaleimide-(2,2,4-trimethyl) hexane.

15. A resin film made from the resin composition of claim 1.

16. A prepreg made from the resin composition of claim 1.

17. A copper-clad laminate made from the prepreg of claim 16.

18. A printed circuit board comprising the copper-clad laminate of claim 17.

\* \* \* \* \*